United States Patent
Yamazaki

(10) Patent No.: US 10,669,379 B2
(45) Date of Patent: Jun. 2, 2020

(54) ADDITION-CURABLE SILICONE RESIN COMPOSITION AND DIE ATTACH MATERIAL FOR OPTICAL SEMICONDUCTOR DEVICE

(71) Applicant: Shin-Etsu Chemical Co., Ltd., Tokyo (JP)

(72) Inventor: Tatsuya Yamazaki, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 200 days.

(21) Appl. No.: 15/883,330

(22) Filed: Jan. 30, 2018

(65) Prior Publication Data

US 2018/0237591 A1 Aug. 23, 2018

(30) Foreign Application Priority Data

Feb. 17, 2017 (JP) .................. 2017-027858

(51) Int. Cl.
*C08G 77/20* (2006.01)
*C08L 83/04* (2006.01)
*H01L 33/56* (2010.01)
*C08G 77/12* (2006.01)

(52) U.S. Cl.
CPC .............. *C08G 77/20* (2013.01); *C08L 83/04* (2013.01); *C08G 77/12* (2013.01); *H01L 33/56* (2013.01)

(58) Field of Classification Search
None
See application file for complete search history.

(56) References Cited

U.S. PATENT DOCUMENTS

| | | | | |
|---|---|---|---|---|
| 4,322,518 A | * | 3/1982 | Blizzard | C08G 77/12 427/387 |
| 4,707,531 A | * | 11/1987 | Shirahata | C08G 77/06 528/12 |
| 5,338,817 A | * | 8/1994 | Mine | C08G 77/12 528/12 |
| 5,527,873 A | * | 6/1996 | Kobayashi | C08G 77/06 525/478 |
| 8,772,812 B2 | | 7/2014 | Yoshitake et al. | |
| 8,987,021 B2 | | 3/2015 | Okuyama | |
| 9,045,637 B2 | | 6/2015 | Meguriya et al. | |
| 2006/0275617 A1 | * | 12/2006 | Miyoshi | C08L 83/04 428/448 |
| 2016/0204321 A1 | | 7/2016 | Naka et al. | |
| 2016/0251482 A1 | * | 9/2016 | Yamazaki | C09J 183/04 525/478 |

FOREIGN PATENT DOCUMENTS

| | | |
|---|---|---|
| JP | 2008-255227 A | 10/2008 |
| JP | 2012-12434 A | 1/2012 |
| JP | 2013-254893 A | 12/2013 |
| JP | 2016-122828 A | 7/2016 |

* cited by examiner

*Primary Examiner* — Robert S Loewe
(74) *Attorney, Agent, or Firm* — Birch, Stewart, Kolasch & Birch, LLP

(57) ABSTRACT

Provided is a silicone resin composition having a low level of contamination to gold pad portions on an LED chip during curing of the composition and is excellent in adhesiveness to the silver lead frame on a substrate formed of a reflector member. An addition-curable silicone resin composition comprising (A-1) a linear organopolysiloxane having, per molecule, two or more alkenyl groups having 2 to 8 carbon atoms, (A-2) a branched organopolysiloxane having, per molecule, two or more alkenyl groups having 2 to 8 carbon atoms, (B-1) a branched organohydrogenpolysiloxane, wherein the weight average molecular weight of the polysiloxane and the content of SiH group-containing organosilicon compounds having 1 to 10 silicon atoms are each in a specified range, (B-2) a linear organohydrogenpolysiloxane, wherein the content of SiH group-containing organosilicon compounds having 1 to 10 silicon atoms is in a specified range, and (C) an addition reaction catalyst.

8 Claims, No Drawings

ADDITION-CURABLE SILICONE RESIN COMPOSITION AND DIE ATTACH MATERIAL FOR OPTICAL SEMICONDUCTOR DEVICE

CROSS-REFERENCE TO RELATED APPLICATION

This non-provisional application claims priority under 35 U.S.C. § 119(a) on Patent Application No. 2017-027858 filed in Japan on Feb. 17, 2017, the entire contents of which are hereby incorporated by reference.

TECHNICAL FIELD

The present invention relates to a silicone resin composition and a die attach material for optical semiconductor devices, that have a low level of contamination to gold pad portions on an optical semiconductor chip during curing and are excellent in the adhesiveness to the silver lead frame on a substrate formed of a reflector member.

BACKGROUND ART

Optical semiconductors (LEDs) have rapidly become widespread in recent years because of having advantages of lower power consumption and longer life, in comparison with conventional light-emitting devices such as light bulbs and fluorescent lamps. When optical semiconductor devices are manufactured, a curable resin composition, called a die attach material, which is used for the purpose of fixing an optical semiconductor chip on a substrate is first applied at a predetermined position on the substrate of the optical semiconductor. As methods for applying a die attach material, two methods are commonly used, a dispensing method in which a resin filled in a syringe is discharged from a needle attached to the tip of the syringe, by applying pressure, to transfer it onto a substrate, and a stamping method in which a transfer pin is pressed into a resin which has been spread in a thin film on a resin plate, and then the pin with the resin attached thereon is pressed onto a substrate, thereby to transfer the resin onto it. Subsequently, a die bonding process is performed in which on the top of the applied resin composition is pressure-bonded an LED chip which has a most portion of its bottom part formed of sapphire, followed by a process in which the resin composition is cured. After that, a wire bonding process is performed in which the electrode pad portions, mostly formed of gold, of the optical semiconductor chip and the electrically conductive lead frame portion, mostly formed of silver, on the substrate are bonded by a gold wire. In the wire bonding process, the gold ball formed at the tip portion of the capillary is pressed against the electrode pad portion while applying ultrasonic waves. In this process, when the LED chip is not sufficiently fixed on the substrate, there is caused a problem that ultrasonic wave diffuses to the surroundings during the pressing, whereby the gold wire cannot be bonded with sufficient strength. Further, when after the LED device has been manufactured through post-processes, the LED chip floats from the substrate during the lighting operation, heat dissipation from the LED chip, which is a heating element, to the substrate cannot be sufficiently achieved, giving rise to a possibility that malfunctioning of the LED device is caused. For these reasons, a curable resin composition capable of giving a cured product with high strength and high adhesiveness is employed for a die attach material, in order that an LED chip is sufficiently fixed on a substrate.

Additionally, addition-curable silicone resin compositions such as ones derived from methylsilicones are widely used as a die attach material for high-power blue LED devices that frequently are used in lighting applications, from the viewpoint of imparting heat resistance and light resistance. However, it has been reported that contaminants are formed on gold electrode pad portions of an optical semiconductor chip during the curing of the resin composition, due to various factors such as the type of the addition-curable silicone resin composition and optical semiconductor chip used and the conditions under which the resin composition has been cured. Contaminants that are present on electrode pad portions give rise to problems because of causing adverse effects in the subsequent wire bonding process. Such contaminants are ascribed to low molecular weight siloxanes contained in the addition-curable silicone resin composition, and it is a problem that in particular, when the resin composition is subjected to curing, low molecular weight siloxanes having a hydrogen atom bonded to a silicon atom (SiH group) are heated, leading to volatilization and diffusion, so that they undergo hydrolysis reaction or the like, thereby resulting in the formation of a film, or the generation of gel, which adheres as contaminants, on the electrode pad portion. It is known that decreasing the content of low molecular weight siloxanes having a SiH group in the resin composition makes it possible to reduce the amount of contaminants to the LED chip electrode pad portion that are attached during the heat curing of the composition, leading to an improvement in the wire bonding property.

A die attach material is usually used such that the transferring of it onto a substrate and crimping of an LED chip are performed in an amount at which a fillet portion is formed around the chip, in order to reinforce the fixation of the LED chip to the substrate. When the resin has a low level of retention on the substrate, the fillet portion thinly spreads more widely to the surroundings immediately after the chip is crimped. In such a case, since the surface area of the resin portion becomes larger, a larger amount of SiH group-containing low molecular weight siloxanes in the resin composition is prone to volatilize during the curing, resulting in an increased level of adhesion of contaminants to the electrode pad portion of the LED chip.

Furthermore, addition-curable silicone resin compositions such as ones derived from methylsilicones are inferior in the adhesiveness to substrates, relative to conventional epoxy resins, due to the polarity of the resin and others. In particular, in comparison of the sapphire at the bottom of an LED chip, which is an adherend to a die attach material, and the silver lead frame portion, there is an increased tendency that the adhesiveness of the resin to the latter is poor. Usually in an LED package, a white resin called a reflector is molded in a lead frame. In cases when for a reflector member, use is made of an epoxy molding compound (hereinafter referred to as an "EMC") which has an even higher adhesiveness to a molding die in comparison with thermoplastic resins such as polyphthalamides, a predetermined amount of a wax is commonly added in order to improve mold release characteristics. The LED package molded with an EMC undergoes a chemical etching process with an acid or a base, or a physical etching process by blast cleaning, etc. However, when the wax component that has oozed out to the lead frame during the molding process is not sufficiently removed by the etching process, the adhesiveness between the lead frame portion and the die attach material becomes deteriorated.

In JP-A 2013-254893 (Patent Document 1), it has been reported that by using an LED chip in which a metal protective layer containing Ni or Ta is provided on the gold electrode portion, good wire bonding properties can be achieved also in cases of using a die attach material which is made of an addition-curable silicone resin causing a high level of electrode contamination. However, LED chips having such a protective layer have a higher manufacturing cost than common LED chips having no protective layer, so that there is a need for a die attach material itself that results in a reduced level of electrode contamination.

In JP-A 2016-122828 (Patent Document 2), it has been reported that the light-emitting efficiency of an LED device is improved by using a sulfur-derived brightener on the silver lead frame of an LED package molded with an EMC. However, when such a brightener is used on the silver surface of the silver lead frame, there is a possibility that the adhesiveness of the die attach material is reduced, and thus it is required that a die attach material be provided with an even higher adhesiveness to a substrate.

For example, it has been reported in JP-A 2008-255227 (Patent Document 3) that in an addition-curable silicone resin composition, the low molecular weight siloxane component contained in the resin composition includes many low molecular weight siloxanes containing a SiH group, which is a reactive group, in addition to nonfunctional low molecular weight siloxane components represented by D3 and D4. It has been described that especially by setting the content of low molecular weight siloxane compounds having a degree of polymerization of 10 or less and containing one or more SiH groups per molecule to be a given weight % or less of the entire silicone resin composition, the adhesion of contaminants to the surroundings during the heat curing of the composition can be prevented. However, the addition-curable silicone resin compositions described in the examples have concerns about adhesion strength when used as a die attach material for LED devices, because the cured materials derived from these compositions are soft, wherein their hardness as defined in JIS K 6249 and measured with a type A durometer is 32 to 66.

In JP-A 2012-12434 (Patent Document 4), it has been reported that an addition-curable silicone resin composition that is a combination of a linear organopolysiloxane, wherein the a type D durometer hardness as defined in JIS K 6253 is 30 to 70 and the organohydrogensiloxane component has a SiH group in the side chain, and a branched organopolysiloxane which has a SiH group at a terminus thereof is superior in light transmission and durability of adhesiveness. However, when the composition is used as a die attach material for an LED device, JP-A 2012-12434 is silent on the contamination to the gold pad portion on an LED chip during the curing of the composition.

As described above, conventional addition-curable silicone resin compositions are problematic: when they are used especially as a die attach material for an LED device, there are caused problems that contaminants adhere to the electrode pad portion on an LED chip during the curing of the composition, resulting in a decrease in the wire bonding property, and they bring about an insufficient adhesiveness to the silver lead frame portion on an optical semiconductor substrate molded with a reflector member.

CITATION LIST

Patent Document 1: JP-A 2013-254893
Patent Document 2: JP-A 2016-122828

Patent Document 3: JP-A 2008-255227
Patent Document 4: JP-A 2012-12434

SUMMARY OF THE INVENTION

The present invention has been made in view of the above circumstances, and an object thereof is to provide an addition-curable silicone resin composition, and a die attach material made of the composition and used for optical semiconductor devices, that has a lower level of contamination to the gold pad portion on an LED chip during its curing and is excellent in the adhesiveness to the silver lead frame on a substrate formed of a reflector member.

The present inventors made intensive investigations to achieve the above object, with the result that it was found that when an addition-curable silicone resin composition comprising the components (A-1), (A-2), (B-1), and (B-2) defined below is used as a die attach material for optical semiconductor devices, there was provided a lower level of contamination to the gold pad portion on an LED chip during the curing of the composition and an excellent adhesiveness to the silver lead frame on a substrate formed of a reflector member, thereby leading to the completion of the present invention.

Accordingly, the present invention provides an addition-curable silicone resin composition and a die attach material described below.

[1] An addition-curable silicone resin composition comprising, as essential components, (A-1) a linear organopolysiloxane having, per molecule, two or more alkenyl groups having 2 to 8 carbon atoms;

(A-2) a branched organopolysiloxane having, per molecule, two or more alkenyl groups having 2 to 8 carbon atoms, represented by the formula (1):

$$(R^1{}_3SiO_{1/2})_a(R^2{}_3SiO_{1/2})_b(SiO_{4/2})_c \quad (1)$$

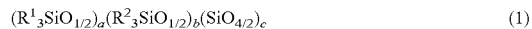

wherein $R^1$s are each an alkenyl group having 2 to 8 carbon atoms, $R^2$s are each an alkyl group having 1 to 12 carbon atoms, and $0<a<0.15$, $0\leq b<0.6$, and $0<c<0.7$, provided that $a+b+c=1$;

(B-1) a liquid branched organohydrogenpolysiloxane having, per molecule, two or more hydrogen atoms directly bonded to a silicon atom, represented by the formula (2):

$$(HR^2{}_2SiO_{1/2})_d(R^2{}_3SiO_{1/2})_e(SiO_{4/2})_f \quad (2)$$

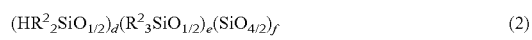

wherein $R^2$s are each the same as defined above, and $0<d<0.6$, $0\leq e<0.4$, and $0<f<0.6$, provided that $d+e+f=1$, wherein the weight average molecular weight of the polysiloxane is 1,500 to 6,000 and the content of SiH group-containing organosilicon compounds having 1 to 10 silicon atoms is 5 weight % or less;

(B-2) a linear organohydrogenpolysiloxane represented by the formula (3):

$$(R^2{}_3SiO_{1/2})_2(HR^2SiO_{2/2})_x(R^2{}_2SiO_{2/2})_y \quad (3)$$

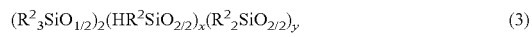

wherein $R^2$s are each the same as defined above, x and y are integers satisfying $0<x<100$ and $0\leq y<10$, provided that $20\leq x+y\leq 100$, wherein the content of SiH group-containing organosilicon compounds having 1 to 10 silicon atoms is 5 weight % or less; and (C) an addition reaction catalyst.

[2] The addition-curable silicone resin composition according to [1], wherein the linear organopolysiloxane serving as the component (A-1) is an alkenyl group-containing linear organopolysiloxane represented by the formula (4):

$$CH_2=CH-\underset{R^4}{\underset{|}{Si}}O\left(\underset{R^2}{\underset{|}{Si}}O\right)_k\underset{R^4}{\underset{|}{Si}}-CH=CH_2 \quad (4)$$

wherein $R^4$s are each independently an alkenyl group having 2 to 8 carbon atoms or an alkyl group having 1 to 12 carbon atoms, $R^2$s are each an alkyl group having 1 to 12 carbon atoms, and k is an integer satisfying k>0 and allows the linear organopolysiloxane to have a viscosity at 25° C., measured by the method described in JIS Z 8803: 2011, of 10 to 1,000,000 mPa·s.

[3] The addition-curable silicone resin composition according to [1] or [2], wherein the component (B-1) has a viscosity at 25° C., measured by the method described in JIS Z 8803: 2011, of 10 Pa·s or higher.

[4] The addition-curable silicone resin composition according to any of [1] to [3], wherein the component (B-1) is an organohydrogenpolysiloxane prepared using a partial hydrolysate of a tetraalkoxysilane as a raw material.

[5] The addition-curable silicone resin composition according to any of [2] to [4], wherein in the $R^2$s of the components (A-1), (A-2), (B-1), and (B-2), 90 mol % or more of all the $R^2$s are a methyl group.

[6] The addition-curable silicone resin composition according to any of [1] to [5], further containing (D) an adhesive aid component represented by the formula (5):

$$(MeSiO_{3/2})_m(EpMeSiO_{2/2})_n(Me_2SiO_{2/2})_p(ViMeSiO_{2/2})_q(R^3O_{1/2})_r \quad (5)$$

wherein Me is a methyl group, Ep is a monovalent organic group having an epoxy group, Vi is a vinyl group, $R^3$ is an alkyl group having 1 to 12 carbon atoms, and 0<m<0.3, 0<n<0.15, 0<p<0.8, 0<q<0.1, and 0≤r<0.05, provided that m+n+p+q+r=1.

[7] The addition-curable silicone resin composition according to any of [1] to [6], further containing, as (E) a diluent, a hydrocarbon compound that has a boiling point in the range of 200 to 350° C. under atmospheric pressure (1013 hPa) and is liquid at 25° C.

[8] A die attach material for an optical semiconductor device, comprising the silicone resin composition according to any of [1] to [7] described above.

Advantageous Effects of the Invention

The addition-curable silicone resin composition of the present invention, when used as a die attach material for an LED, enhances reliability because it results in a reduced level of contamination to the gold pad portion on an optical semiconductor chip during its curing, makes it possible to give good wire bonding property, and exhibits an excellent adhesiveness to the silver lead frame on a substrate formed of a reflector member. Therefore, the addition-curable silicone resin composition of the present invention is extremely useful as a die attach material for LEDs.

The reason why such an effect is achieved is believed to be, for example, that the use of the above-described specific organohydrogenpolysiloxanes in a particular combination as specified herein results in a lower content of volatile low molecular weight siloxanes having a SiH group in the resulting addition-curable silicone resin composition, relative to organohydrogenpolysiloxanes used in usual addition-curable silicone resin compositions, allows the curing of the composition to take place with a strength at which an LED chip can be sufficiently fixed within a predetermined curing time, and although the resulting addition-curable silicone resin composition exhibits good curability, maintains such a balance that the adhesion contributing component in the resin is sufficiently compatible with the substrate.

DESCRIPTION OF THE PREFERRED EMBODIMENT

Hereinafter, the present invention is described in more detail.

An addition-curable silicone resin composition of the present invention contains, as essential components, (A-1) a linear organopolysiloxane having, per molecule, two or more alkenyl groups having 2 to 8 carbon atoms;

(A-2) a branched organopolysiloxane having, per molecule, two or more alkenyl groups having 2 to 8 carbon atoms, represented by the formula (1):

$$(R^1_3SiO_{1/2})_a(R^2_3SiO_{1/2})_b(SiO_{4/2})_c \quad (1)$$

wherein $R^1$s are each an alkenyl group having 2 to 8 carbon atoms, $R^2$s are each an alkyl group having 1 to 12 carbon atoms, and 0<a<0.15, 0≤b<0.6, and 0<c<0.7, provided that a+b+c=1;

(B-1) a liquid branched organohydrogenpolysiloxane having, per molecule, two or more hydrogen atoms directly bonded to a silicon atom, represented by the formula (2):

$$(HR^2_2SiO_{1/2})_d(R^2_3SiO_{1/2})_e(SiO_{4/2})_f \quad (2)$$

wherein $R^2$s are each the same as defined above, and 0<d<0.6, 0≤e<0.4, and 0<f<0.6, provided that d+e+f=1, wherein the weight average molecular weight of the polysiloxane is 1,500 to 6,000 and the content of SiH group-containing organosilicon compounds having 1 to 10 silicon atoms is 5 weight % or less;

(B-2) a linear organohydrogenpolysiloxane represented by the formula (3):

$$(R^2_3SiO_{1/2})_2(HR^2SiO_{2/2})_x(R^2_2SiO_{2/2})_y \quad (3)$$

wherein $R^2$s are each the same as defined above, x and y are integers satisfying 0<x<100 and 0≤y<10, provided that 20≤x+y≤100, wherein the content of SiH group-containing organosilicon compounds having 1 to 10 silicon atoms is 5 weight % or less; and (C) an addition reaction catalyst.

(A-1) Linear Organopolysiloxane

The component (A-1) is a linear organopolysiloxane having, per molecule, two or more alkenyl groups having 2 to 8 carbon atoms. The component (A-1) is preferably especially a linear organopolysiloxane in which an alkenyl group bonded to a silicon atom is located only at both ends of the molecule, and is suitably especially one represented by the general formula (4):

$$CH_2=CH-\underset{R^4}{\underset{|}{Si}}O\left(\underset{R^2}{\underset{|}{Si}}O\right)_k\underset{R^4}{\underset{|}{Si}}-CH=CH_2 \quad (4)$$

wherein $R^4$s are each independently an alkenyl group having 2 to 8 carbon atoms or an alkyl group having 1 to 12 carbon atoms, and $R^2$s are each an alkyl group having 1 to 12 carbon atoms. k is an integer satisfying k>0 and allows the linear organopolysiloxane to have a viscosity at 25° C., measured by the method described in JIS Z 8803: 2011, of 10 to 1,000,000 mPa·s.

In the formula (4), examples of an alkenyl group denoted by $R^4$ which has 2 to 8 carbon atoms, particularly 2 to 6 carbon atoms, specifically include, for example, vinyl, allyl, isopropenyl, butenyl, pentenyl, hexenyl, and cyclohexenyl groups, and examples of an alkyl group denoted by $R^4$ which has 1 to 12 carbon atoms, particularly 1 to 10 carbon atoms, may specifically include, for example, such alkyl groups as methyl, ethyl, propyl, isopropyl, butyl, isobutyl, tert-butyl, pentyl, neopentyl, hexyl, cyclohexyl, octyl, nonyl and decyl groups. The alkenyl group denoted by $R^4$ is particularly preferably a vinyl group. The alkyl group denoted by $R^4$ is preferably such alkyl groups as methyl, ethyl, propyl, and isopropyl groups, particularly with a methyl group being preferable, in view of the resistance to discoloration of a cured silicone material prepared from the resulting addition-curable silicone resin composition when the cured silicone material is allowed to stand for a long time under high temperature conditions or under blue light of a wavelength of 450 nm.

Examples an alkyl group denoted by $R^2$ which has 1 to 12 carbon atoms, particularly 1 to 10 carbon atoms, may be groups similar to those exemplified as the above-mentioned alkyl groups for $R^4$, and among them, particularly a methyl group is preferable for the same reason as above.

In comparison with organopolysiloxanes having an alkenyl group in the side chain, the linear organopolysiloxane represented by the above-described formula (4) which contains an alkenyl group only at both ends is superior in reactivity and has an advantage that the cured resin is excellent in elongation, so that cracks and the like are difficult to occur.

A linear organopolysiloxane that is used as component (A-1) preferably has a viscosity at 25° C. in the range of 10 to 1,000,000 mPa·s, more preferably 10 to 100,000 mPa·s. When the linear organopolysiloxane has a viscosity at 25° C. below this range, the strength of the resulting cured product may be reduced. When the linear organopolysiloxane has a viscosity at 25° C. above this range, the viscosity of the resulting composition is increased, whereby the applying properties thereof may be decreased. When the component (A-1) is a mixture of two or more materials, it is preferable that the viscosity of the mixture is in the range of 10 to 1,000,000 mPa·s at 25° C. In the present invention, the viscosity refers to values measured by a rotational viscometer at 25° C. according to the method described in JIS K 7117-1: 1999.

Examples of the component (A-1) may specifically include compounds represented by:

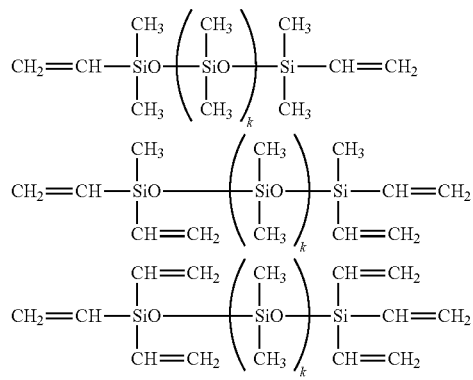

wherein k in each of these formulae is the same as above.
(A-2) Branched Organopolysiloxane The component (A-2) is a branched organopolysiloxane having, per molecule, two or more alkenyl groups having 2 to 8 carbon atoms, represented by the formula (1):

$$(R^1{}_3SiO_{1/2})_a(R^2{}_3SiO_{1/2})_b(SiO_{4/2})_c \quad (1)$$

wherein $R^1$s are each an alkenyl group having 2 to 8 carbon atoms, $R^2$s are each an alkyl group having 1 to 12 carbon atoms, and $0<a<0.15$, $0\leq b<0.6$, and $0<c<0.7$, provided that $a+b+c=1$.

In the formula (1), examples of an alkenyl group denoted by $R^1$ which has 2 to 8 carbon atoms, particularly 2 to 6 carbon atoms, specifically include, for example, a vinyl group, an allyl group, an isopropenyl group, a butenyl group, a pentenyl group, a hexenyl group, and a cyclohexenyl group, particularly with a vinyl group being preferable.

In the formula (1), examples of an alkyl group denoted by $R^2$ which has 1 to 12 carbon atoms, particularly 1 to 10 carbon atoms, may specifically include, for example, such alkyl groups as methyl, ethyl, propyl, isopropyl, butyl, isobutyl, tert-butyl, pentyl, neopentyl, hexyl, cyclohexyl, octyl, nonyl, and decyl groups. The alkyl group denoted by $R^2$ is preferably such alkyl groups as methyl, ethyl, propyl, and isopropyl groups, particularly with a methyl group being preferable, in view of the resistance to discoloration of a cured silicone material prepared from the resulting addition-curable silicone resin composition when the cured silicone material is allowed to stand for a long time under high temperature conditions or under blue light of a wavelength of 450 nm.

As described above, the branched organopolysiloxane having an alkenyl group only in the M unit is excellent in reactivity with SiH group-containing organohydrogenpolysiloxanes, regardless of whether they are low molecular weight molecules, and thus makes it possible to prevent SiH group-containing low molecular weight siloxanes from dispersing to the surroundings and forming contaminants during the curing of the composition, in comparison with organopolysiloxanes having an alkenyl group in the D unit or in the T unit.

The content ratio a of the $R^1{}_3SiO_{1/2}$ unit in the formula (1) is in the range of $0<a<0.15$, particularly preferably $0.05\leq a\leq 0.1$, with respect to the sum of the siloxane units: $a+b+c=1$. The content ratio b of the $R^2{}_3SiO_{1/2}$ unit is in the range of $0\leq b<0.6$, particularly preferably $0.3\leq b<0.5$, with respect to the sum of the siloxane units: $a+b+c=1$. The content ratio c of the $SiO_{4/2}$ unit is in the range of $0<c<0.7$, particularly preferably $0.4\leq c\leq 0.6$, with respect to the sum of the siloxane units: $a+b+c=1$.

The above-described component (A-2) may be easily synthesized by mixing compounds that serve as sources for the respective units, at ratios corresponding to their contents within the above-mentioned ranges, followed by, for example, co-hydrolytic condensation in the presence of an acid.

Herein, the source of the $R^1{}_3SiO_{1/2}$ unit may be exemplified by organosilicon compounds such as triorganochlorosilanes, triorganoalkoxysilanes, and hexaorganodisiloxanes represented by the structural formulae described below, but the source of the $R^1{}_3SiO_{1/2}$ unit that can be used is not limited thereto. (In the formulae below, Me represents a methyl group, and Et represents an ethyl group.)

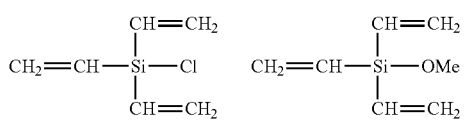

-continued

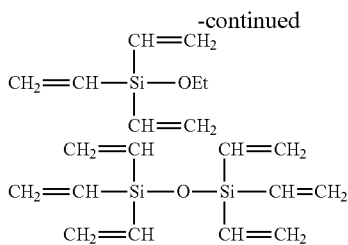

Herein, the source of the $R^2_3SiO_{1/2}$ unit may be exemplified by organosilicon compounds such as triorganochlorosilanes, triorganoalkoxysilanes, and hexaorganodisiloxanes represented by the structural formulae described below, but the source of the $R^2_3SiO_{1/2}$ unit that can be used is not limited thereto. (In the formulae below, Me represents a methyl group, and Et represents an ethyl group.)

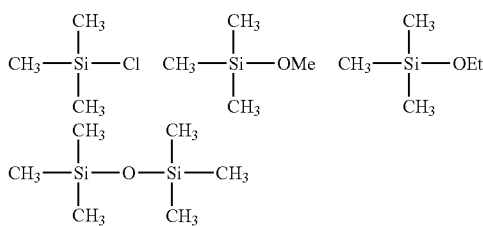

Herein, the source of the $SiO_{4/2}$ unit may be exemplified by organosilicon compounds such as tetrachlorosilane and tetraalkoxysilanes represented by the structural formulae described below, but the source of the $SiO_{4/2}$ unit that can be used is not limited thereto. (In the formulae below, Me represents a methyl group and Et represents an ethyl group.)

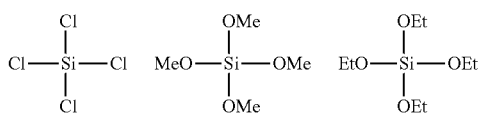 [SMILES: Cl[Si](Cl)(Cl)Cl ; CO[Si](OC)(OC)OC ; CCO[Si](OCC)(OCC)OCC]

The amounts of the above-described components (A-1) and (A-2) to be mixed in the silicone resin composition is preferably in the range of (A-1):(A-2)=55:45 to 85:15, particularly preferably 60:40 to 80:20, by weight ratio. When the amount of component (A-1) to be mixed exceeds the above range, there is a possibility that the resulting cured silicone material exhibits reduced strength. When the amount of component (A-1) to be mixed is below the above range, the resulting cured silicone material may have sufficient hardness.

(B-1) Branched Organohydrogenpolysiloxane

The component (B-1) of the present invention is represented by the formula (2) below, and is a liquid branched organohydrogenpolysiloxane having, per molecule, two or more hydrogen atoms directly bonded to a silicon atom, wherein the weight average molecular weight of the polysiloxane is 1,500 to 6,000 and the content of SiH group-containing organosilicon compounds having 1 to 10 silicon atoms is 5 weight % or less.

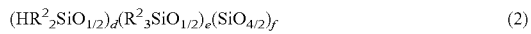

wherein $R^2$s are each the same as defined above, and $0<d<0.6$, $0\le e<0.4$, and $0<f<0.6$, provided that $d+e+f=1$.

The component (B-1) acts as a cross-linking agent, which causes an addition reaction between an alkenyl group (particularly preferably a vinyl group) bonded to a silicon atom in the component (A-1) and in the component (A-2) and a hydrogen atom bonded to a silicon atom in the component (B-1) (a SiH group), resulting in the formation of a cured silicone material from the addition-curable silicone resin composition of the present invention.

In the formula (2), examples of an alkyl group denoted by $R^2$ which has 1 to 12 carbon atoms, particularly 1 to 10 carbon atoms, may specifically include, for example, such alkyl groups as methyl, ethyl, propyl, isopropyl, butyl, isobutyl, tert-butyl, pentyl, neopentyl, hexyl, cyclohexyl, octyl, nonyl, and decyl groups. The alkyl group denoted by $R^2$ is preferably such alkyl groups as methyl, ethyl, propyl, and isopropyl groups, particularly with a methyl group being preferable, in view of the resistance to discoloration of a cured silicone material prepared from the resulting addition-curable silicone resin composition when the cured silicone material is allowed to stand for a long time under high temperature conditions or under blue light of a wavelength of 450 nm.

Such a branched organohydrogenpolysiloxane is highly reactive because it has a SiH group only on the M unit, and can prevent SiH group-containing siloxanes from dispersing to the surroundings and forming contaminants during the curing of the composition, regardless of whether they are low molecular weight molecules. Further, since the branched organohydrogenpolysiloxane contains the Q unit, the strength of the resulting cured material can be improved.

The content ratio d of the $HR^2_2SiO_{1/2}$ unit in the formula (2) is in the range of $0<d<0.6$, particularly preferably $0.2\le d\le 0.5$, with respect to the sum of the siloxane units: $d+e+f=1$. The content ratio e of the $R^2_3SiO_{1/2}$ unit is $0\le e<0.4$, particularly preferably $0\le e\le 0.3$, with respect to the sum of the siloxane units: $d+e+f=1$. The content ratio f of the $SiO_{4/2}$ unit is $0<f<0.6$, particularly preferably $0.45\le f\le 0.55$, with respect to the sum of the siloxane units: $d+e+f=1$.

An organohydrogenpolysiloxane that is used as component (B-1) preferably has a weight average molecular weight in the range of 1,500 or more and 6,000 or less, particularly preferably 2,500 or more and 5,000 or less. When the organohydrogenpolysiloxane has a weight average molecular weight within the above range, the volatility of the organohydrogenpolysiloxane itself is low, so that it is possible to prevent the adhesion of contaminants to the surroundings during the curing of the composition. When the organohydrogenpolysiloxane has a weight average molecular weight below the above range, there is a possibility that the degree of adhesion of contaminants to the surroundings is increased. When the organohydrogenpolysiloxane has a weight average molecular weight exceeding the above range, there is a possibility that workability is reduced. The weight average molecular weight as referred to in the present invention means weight average molecular weights determined using polystyrenes as standard substance by gel permeation chromatography (GPC) in which measurements are made under the following conditions.

[Measurement Conditions]

Developing solvent: tetrahydrofuran (THF)
Flow rate: 0.6 mL/min
Detector: differential refractive index detector (RI)
Column: TSK Guardcolomn Super H-L
TSKgel Super H4000 (6.0 mm I.D.×15 cm×1)
TSKgel Super H3000 (6.0 mm I.D.×15 cm×1)
TSKgel Super H2000 (6.0 mm I.D.×15 cm×2)
(all manufactured by Tosoh Corporation)

Column temperature: 40° C.

Sample injection volume: 20 μL (THF solutions with a concentration of 0.5 weight %)

For the above-described component (B-1), the content of SiH group-containing organosilicon compounds having 1 to 10 silicon atoms is 5 weight % or less, preferably 2.5 weight % or less, more preferably 1 weight % or less. When the content of such SiH group-containing low molecular weight organosilicon compounds is not more than the above-mentioned value, it is possible that smaller amounts of these SiH group-containing low molecular weight organosilicon compounds volatilize and contaminant deposition to the surroundings at the time of curing be minimized. The content of the SiH group-containing low molecular weight organosilicon compounds may be 0 weight %.

The content of SiH group-containing organosilicon compounds having 1 to 10 silicon atoms as referred to in the present invention is meant to refer to the content of these organosilicon compounds quantitatively determined by gas chromatography in which measurements are made under the following conditions.

[Measurement Conditions]

Equipment: GC-2014
(manufactured by SHIMADZU CORPORATION)
Column: Product name: HP-5 MS
(manufactured by Agilent Technologies; inner diameter: 0.25 mm, length: 30 m, filler: (5%-phenyl)-methylpolysiloxane)
Detector: FID detector (Detector temperature: 300° C.)
Sample: A solution in which 1.0 g of a sample was dissolved in 10 mL of a standard solution of n-tetradecane in acetone (having a concentration of 20 μg/mL) was used as a sample solution.
Injection volume: 1 μL
Oven temperature: 50° C. to 280° C. over 23 minutes to 280° C. over 17 minutes
Carrier gas: Type: He, linear velocity: 34.0 cm/s A liquid branched organohydrogenpolysiloxane that is used as component (B-1) preferably has a viscosity at 25° C., measured by the method described in JIS Z 8803: 2011, of 10 Pa·s or more, more preferably 200 Pa·s or more. When component (B-1) satisfies the above-mentioned viscosity, the volatility of the organohydrogenpolysiloxane itself is low, so that the adhesion of contaminants to the surroundings during the curing of the composition can be prevented. In the present invention, a liquid substance refers to one having flowability allowing the viscosity to be measured at 25° C. with a rotational viscometer, particularly one having a viscosity at 25° C. of 10,000 Pa·s or less.

Further, an organohydrogenpolysiloxane that is used as component (B-1) preferably has two or more SiH groups per molecule, and in addition, the amount of SiH group in the organohydrogenpolysiloxane is preferably 0.1 to 2 mol/100 g, particularly preferably 0.2 to 0.9 mol/100 g.

As in the case of the above-described component (A-2), the component (B-1) may be easily synthesized by mixing compounds that serve as sources for the respective units, at ratios corresponding to their contents within the above-mentioned ranges, followed by, for example, co-hydrolytic condensation in the presence of an acid.

Herein, the source of the $HR^2{}_2SiO_{1/2}$ unit may be exemplified by organosilicon compounds such as tetramethyldisiloxane represented by the following structural formula, but the source of the $HR^2{}_2SiO_{1/2}$ unit that may be used is not limited thereto. (Me represents a methyl group, Et represents an ethyl group.

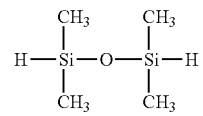

Herein, the source of the $R^2{}_3SiO_{1/2}$ unit may be exemplified by the same organosilicon compounds as in the case of the source of the $R^2{}_3SiO_{1/2}$ unit in the component (A-2).

The source of the $SiO_{4/2}$ unit described above may be exemplified by the same organosilicon compounds as in the case of the source of the $SiO_{4/2}$ unit in the component (A-2), and is particularly preferably, for example, a partially hydrolytic condensate of tetramethoxysilane and/or tetraethoxysilane represented by the structural formulae described below. The source of $SiO_{4/2}$ unit that may be used is not limited to these. (In the formulae below, Me represents a methyl group and Et represents an ethyl group.

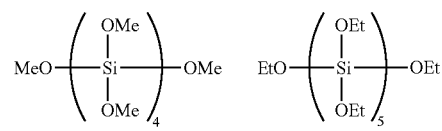

When a partially hydrolytic condensate of tetramethoxysilane and/or tetraethoxysilane is used as the source of the $SiO_{4/2}$ unit described above, it is possible to obtain an organohydrogenpolysiloxane which has an increased weight average molecular weight and a low content of volatile SiH group-containing low molecular weight siloxanes.

When a partially hydrolytic condensate of tetramethoxysilane and/or tetraethoxysilane is used as the source of the $SiO_{4/2}$ unit described above, it is preferable that the content of the monomer components, such as tetramethoxysilane, contained in the partially hydrolytic condensate is small. The content of the monomer components is preferably 10 weight % or less, particularly preferably 5 weight % or less. When a high amount of the monomer components is present in the hydrolytic condensate, the component (B-1) includes a high amount of volatile SiH group-containing low molecular weight siloxanes, so that there is a possibility of increasing the contamination to the surroundings during the curing of the composition.

(B-2) Linear Organohydrogenpolysiloxane

The component (B-2) of the present invention is an organohydrogenpolysiloxane represented by the formula (3) below and in which the content of SiH group-containing organosilicon compounds having 1 to 10 silicon atoms is 5 weight % or less.

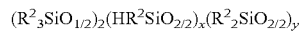

(3)

wherein $R^2$s are each the same as defined above, and x and y are integers satisfying $0<x<100$, and $0 \leq y<10$, provided that $20 \leq x+y \leq 100$.

As in the case of the above-described component (B-1), the component (B-2) acts as a cross-linking agent, which causes an addition reaction between an alkenyl group (particularly preferably a vinyl group) bonded to a silicon atom in the component (A-1) and in the component (A-2) and a hydrogen atom bonded to a silicon atom in the component (B-1) (a SiH group), resulting in the formation of a cured silicone material from the addition-curable silicone resin composition of the present invention.

In the formula (2), examples of an alkyl group denoted by $R^2$ which has 1 to 12 carbon atoms, particularly 1 to 10 carbon atoms, may specifically include, for example, such alkyl groups as methyl, ethyl, propyl, isopropyl, butyl, isobutyl, tert-butyl, pentyl, neopentyl, hexyl, cyclohexyl, octyl, nonyl, and decyl groups. The alkyl group denoted by $R^2$ is preferably such alkyl groups as methyl, ethyl, propyl, and isopropyl groups, particularly with a methyl group being preferable, in view of the resistance to discoloration of a cured silicone material prepared from the resulting addition-curable silicone resin composition when the cured silicone material is allowed to stand for a long time under high temperature conditions or under blue light of a wavelength of 450 nm.

The linear organohydrogenpolysiloxane described above, which is rich in siloxane units having SiH on the D unit, makes it possible that the curability of the composition is adjusted by steric hindrance during the addition curing reaction. Further, the linear organohydrogenpolysiloxane has high wettability with a substrate, and the SiH group that remains without being incorporated into the addition curing reaction with the alkenyl group due to steric hindrance is converted into a SiOH group by the addition reaction catalyst, thereby making it possible to contribute to an improvement in the adhesiveness to the substrate.

The content x of the $HR^2SiO_{2/2}$ unit in the formula (3) is in the range of $0<x<100$, particularly preferably $30 \leq x \leq 60$, with respect to the sum of the siloxane units: $20 \leq x+y \leq 100$. The content y of the $R^2_2SiO_{2/2}$ unit is in the range of $0 \leq y<10$, particularly preferably $0 \leq y<5$, with respect to the sum of the siloxane units $20 \leq x+y \leq 100$.

For the above-described component (B-2), the content of SiH group-containing organosilicon compounds having 1 to 10 silicon atoms is 5 weight % or less, preferably 2.5 weight % or less, more preferably 1 weight % or less, as in the case of the above-described component (B-1). When the content of such SiH group-containing low molecular weight siloxanes is not more than the above-mentioned value, it is possible that smaller amounts of these SiH group-containing low molecular weight siloxanes from volatilize and contaminant deposition to the surroundings at the time of curing be minimized. The content of the SiH group-containing low molecular weight siloxanes may be 0 weight %.

In addition, the amount of SiH group in an organohydrogenpolysiloxane that is used as component (B-2) is preferably 0.7 to 1.65 mol/100 g, particularly preferably 1.0 to 1.60 mol/100 g.

Examples of an linear organohydrogenpolysiloxane that is used as component (B-2) may specifically include compounds represented by the formulae below:

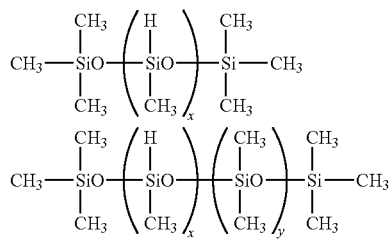

wherein x and y in these formulae are as defined above.

The amounts of the above-described components (B-1) and (B-2) to be mixed in the silicone resin composition are preferably in the range of (B-1):(B-2)=95:5 to 70:30, particularly preferably 90:10 to 75:25, by weight ratio. When the amount of component (B-1) to be mixed exceeds the above range, there is a possibility that the curing reaction proceeds faster, so that sufficient adhesiveness to the substrate is not achieved. On the other hand, when the amount of component (B-1) to be mixed is below the above range, there is a possibility that a cured silicone material with sufficient hardness is not generated in a predetermined curing time.

The total amount of the above-described components (B-1) and (B-2) to be mixed is such that the total amount of hydrogen atoms bonded to silicon atoms in the (B-1)+(B-2) components is preferably in the range of 1.0 to 2.0 moles, particularly preferably 1.1 to 1.5 moles, based on a total of 1 mol of alkenyl groups bonded to silicon atoms in the entire silicone resin composition. When the total amount of hydrogen atoms bonded to silicon atoms in component (B-1) and in component (B-2) falls within the above range, the curing reaction proceeds smoothly and a cured silicone material may be generated with an increased adhesiveness to the substrate. On the other hand, when the total amount of hydrogen atoms bonded to silicon atoms in component (B-1) and in component (B-2) falls outside the above range, the addition curing reaction of the silicone resin composition is difficult to take place, and in addition, there is a possibility that the cured silicone material becomes prone to change over time due to influences of the remaining unreacted functional groups.

In an addition-curable silicone resin composition of the present invention, it is suitable that for $R^2$ in the above-described components (A-1), (A-2), (B-1), and (B-2), 90 mol % or more, preferably 95 mol % or more of the total $R^2$s is a methyl group. When the amount of methyl group for $R^2$ falls within this range, the resulting addition-curable silicone resin composition is excellent in the resistance to discoloration when the cured silicone material is allowed to stand for a long time under high temperature conditions or under blue light of a wavelength of 450 nm.

(C) Addition Reaction Catalyst

An addition reaction catalyst that is used as component (C) is mixed in order that the addition curing reaction of the addition-curable silicone resin composition of the present invention is allowed to take place. Examples of such a catalyst include catalysts based on platinum, palladium, and rhodium, and may be, for example, platinum and platinum-based catalysts such as chloroplatinates, for example, $H_2PtCl_6 \cdot mH_2O$, $K_2PtCl_6$, $KHPtCl_6 \cdot mH_2O$, $K_2PtCl_4$, $K_2PtCl_4 \cdot mH_2O$ (in each of these formulae, m is a positive integer), and complexes of these with hydrocarbons, such as olefins, alcohols, or alkenyl group-containing organopolysiloxanes, from the viewpoint of cost and the like. These may be used alone or in combinations of two or more.

The amount of an addition reaction catalyst to be mixed is preferably in the range of 0.1 to 50 ppm, more preferably 1 to 25 ppm, in terms of the weight of the platinum group metal, based on 100 weight parts of the entire silicone resin composition. When the amount of an addition reaction catalyst to be mixed is below the above range, there is a possibility that the addition curing reaction of the silicone resin composition does not smoothly proceed. On the other hand, when the amount of an addition reaction catalyst to be mixed exceeds the above range, there is a possibility that the cured silicone material becomes prone to be colored.

An addition-curable silicone resin composition of the present invention comprises, as essential components, the above-described components (A-1), (A-2), (B-1), (B-2), and (C), and however, may optionally contains (D) an adhesive aid and (E) a diluent which are described below.

(D) Adhesive Aid

An adhesion aid that is used as component (D) is mixed in order to develop the adhesiveness between the addition-curable silicone resin composition of the present invention and a substrate during the curing of the composition, and is an organopolysiloxane represented by the formula (5):

$$(MeSiO_{3/2})_m(EpMeSiO_{2/2})_n(Me_2SiO_{2/2})_p(ViMeSiO_{2/2})_q(R^3O_{1/2})_r \quad (5)$$

wherein Me is a methyl group, Ep is a monovalent organic group having an epoxy group, Vi is a vinyl group, $R^3$ is an alkyl group having 1 to 12 carbon atoms, and $0<m<0.3$, $0<n<0.15$, $0<p<0.8$, $0<q<0.1$, $0\leq r<0.05$, provided that $m+n+p+q+r=1$.

In the formula (5), examples of a monovalent organic group having an epoxy group which is represented by Ep may specifically include, for example, 3-glycidoxypropyl group, 2-(3,4-epoxycyclohexyl)ethyl group, 5,6-epoxyhexyl group, and 7,8-epoxyoctyl group. In particular, Ep is preferably 3-glycidoxypropyl group from the viewpoint of the storage stability under conditions where the adhesive aid is mixed into the silicone resin composition.

Thus, the organopolysiloxane that has a monovalent organic group having an epoxy group on the D unit has good wettability with a substrate, and can exhibit good adhesiveness to the substrate during the curing of the composition. The organopolysiloxane also has a vinyl group on the D unit, and therefore is incorporated into the cured silicone resin composition by addition curing reaction, thereby making it possible to inhibit bleed-out after the curing, and in addition, is incorporated more mildly into the cured composition, in comparison with organopolysiloxanes having a vinyl group on the M unit, so that it can allow of sufficient compatibility with the substrate. Furthermore, since the organopolysiloxane contains a large amount of dimethylsiloxane units, the organopolysiloxane exhibits better compatibility with a base resin containing the above-described components (A-1) to (B-2), and can result in suppression of discoloration to low levels when the cured silicone material is allowed to stand for a long time under high temperature conditions or under blue light of a wavelength of 450 nm.

The content ratio m of the $MeSiO_{3/2}$ unit in the formula (5) is in the range of $0<m<0.3$, particularly preferably $0.05\leq m\leq 0.25$, with respect to the sum of the siloxane units: $m+n+p+q+r=1$. The content ratio n of the $EpMeSiO_{2/2}$ unit is in the range of $0<n<0.15$, particularly preferably $0.01\leq n\leq 0.12$, with respect to the sum of the siloxane units: $m+n+p+q+r=1$. The content ratio p of the $Me_2SiO_{2/2}$ unit is in the range of $0<p<0.8$, particularly preferably $0.4\leq p\leq 0.7$, with respect to the sum of the siloxane units: $m+n+p+q+r=1$. The content ratio q of the $ViMeSiO_{2/2}$ unit is in the range of $0<q<0.1$, particularly preferably $0.01\leq q\leq 0.08$, with respect to the sum of the siloxane units: $m+n+p+q+r=1$. The content ratio r of the $(R^3O_{1/2})_r$ unit is in the range of $0\leq r<0.05$, particularly preferably $0\leq r<0.03$, with respect to the sum of the siloxane units: $m+n+p+q+r=1$.

The above-described component (D) may be easily synthesized by mixing compounds that serve as sources for the respective units, at ratios corresponding to their contents within the above-mentioned ranges, followed by, for example, co-hydrolytic condensation in the presence of an base.

The source of the $EpMeSiO_{2/2}$ unit may be exemplified by organosilicon compounds such as diorganodialkoxysilanes represented by the structural formulae described below, but the source of the $EpMeSiO_{2/2}$ unit that may be used is not limited thereto. (In the formulae below, Me represents a methyl group and Et represents an ethyl group.)

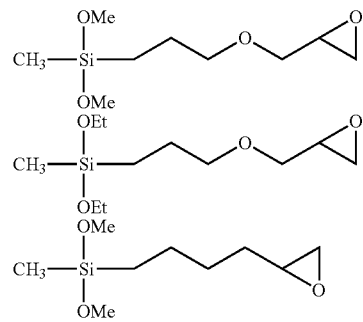

The amount of component (D) to be mixed is preferably in the range of 0.5 to 10 parts by weight, particularly preferably 1 to 8 parts by weight, based on 100 parts by weight of the entire silicone resin composition. When the amount of component (D) to be mixed is below the above range, there is a possibility that the adhesiveness to a substrate is reduced. On the other hand, when the amount of component (D) to be mixed exceeds the above range, there is a possibility that the appearance of the silicone resin composition becomes cloudy.

(E) Diluent

A diluent that is used as component (E) is a hydrocarbon compound that has a boiling point in the range of 200 to 350° C. under atmospheric pressure (1013 hPa) and is liquid at 25° C.

A diluent that is used as component (E) is mixed in order to adjust the viscosity of an addition-curable silicone composition of the present invention. The amount of a diluent to be mixed is preferably in the range of 0.5 to 10 parts by weight, particularly preferably 1 to 8 parts by weight, based on 100 parts by weight of the entire silicone resin composition. When the amount of component (E) to be mixed exceeds the above range, there is a possibility that some of the solvent remains when heat curing of the resin composition is performed, leading to a decrease in the strength of the resulting cured resin. When the amount of component (E) to be mixed is below the above range, there is a possibility that workability is reduced.

The boiling point of component (E) under atmospheric pressure (1013 hPa) is preferably in the range of 200° C. or more and less than 350° C., more preferably in the range of 220° C. or more and 330° C. or less. When the boiling point of component (E) is below the above range, there is a possibility that workability is reduced in a process for die bonding of an LED chip to the resin that has been applied onto a substrate, or that the resin does not spread in an adequate area at the bottom of the chip because the resin composition is thickened by volatilization of the solvent. On the other hand, when the boiling point of component (E) exceeds the above range, there is a possibility that some of the solvent remains when heat curing of the resin composition is performed, leading to a decrease in the strength of the resulting cured resin.

Furthermore, it is suitable that component (E) is subjected to desulfurization treatment, particularly with the sulfur content being more suitably less than 1 ppm, because there is a possibility that sulfur in the component (E) causes inhibition of the addition of an addition-curable silicone resin composition of the present invention. It is also suitable that the aniline point of component (E) is particularly 100° C. or less from the viewpoint of compatibility with an addition-curable silicone resin composition of the present invention.

As a diluent that is used as component (E), use may be made of commercially available products, of which examples may specifically include "Hydroseal G232H" (having a boiling point of 238 to 261° C.), "Hydroseal G240H" (having a boiling point of 255 to 282° C.), "Hydroseal G250H" (having a boiling point of 258 to 326° C.), "Hydroseal G270H" (having a boiling point of 258 to 287° C.), "Hydroseal G3H" (having a boiling point of 277 to 321° C.), and "Hydroseal G400H" (having a boiling point of 305 to 347° C.), all manufactured by TOTAL; "Exxsol™ D95" (having a boiling point of 222 to 242° C.), "Exxsol™ DI 10" (having a boiling point of 248 to 265° C.), "Exxsol™ D130" (having a boiling point of 279 to 313° C.), and "Isoper™ M" (having a boiling point of 224 to 254° C.), all manufactured by ExxsonMobil; and "IP 2028" (having a boiling point of 213 to 262° C.), manufactured by Idemitsu Kosan Co., Ltd. These may be used singly alone or in mixtures of two or more.

A diluent as described above, which is composed of a hydrocarbon compound(s) has high compatibility with silicone resins, and exhibits higher surface tension, in comparison with silicone resins, making it possible to improve the resin retention after a chip is crimped. High levels of resin retention allow the surface area of the resin portion to be kept small, so that it is possible to reduce the risk of dispersion of SiH group-containing low molecular weight siloxanes in the resin composition during the curing. High levels of resin retention also allow the fillet around a chip to be kept in a shape immediately after it is crimped, so that it is possible to prevent the reduction of chip reinforcing effects.

Other Components

In addition to the above-described components (A) to (E), various known additives may optionally be mixed as appropriate, into an addition-curable silicone resin composition of the present invention, to the extent that the object of the present invention is not impaired.

In an addition-curable silicone resin composition of the present invention, an inorganic filler may be mixed as appropriate for the purposes of improving the strength of the resulting cured material and of imparting thixotropy to the resin composition and improving the applying workability of a die attach material. Examples of such an inorganic filler may include, for example, fumed silica, fumed titanium dioxide, and others. In particular, it is suitable, from the viewpoint of the transparency of the resulting cured material, that fumed silica is used as the inorganic filler.

In cases when an inorganic filler is mixed, the amount of the inorganic filler mixed may be preferably in the range of 20 parts by weight or less, more preferably 1 to 10 parts by weight, relative to 100 parts by weight of the entire silicone resin composition. In particular, when fumed silica is used as the inorganic filler, it is suitable, from the viewpoint of the compatibility with the addition-curable silicone resin, that the surface of silica is treated with a hydrophobic group. Examples of the hydrophobic group may specifically include siloxane-derived groups such as a trimethylsilyl group and a dimethylsilyl group. Examples of fumed silica surface-treated with such a siloxane-derived functional group include, as commercially available ones, for example, R812 (having a specific surface area of 230 to 290 $m^2/g$) and RX300 (having a specific surface area of 180 to 220 $m^2/g$), which have been subjected to surface-treatment with trimethylsilyl group, R976 (having a specific surface area of 225 to 275 $m^2/g$) and R976S (having a specific surface area of 215 to 265 $m^2/g$), which have been subjected to surface-treatment with dimethylsilyl group, all manufactured by Nippon Aerosil Co., Ltd. An addition-curable silicone resin composition of the present invention uses, as component (E), an organopolysiloxane containing a monovalent organic group having an epoxy group, for use as an adhesive aid. Since the highly polar epoxy group of the organopolysiloxane strongly interacts with untreated hydroxy groups on the surface of fumed silica, there is a possibility that storage stability is deteriorated when fumed silica having a low degree of surface treatment is added. Therefore, as fumed silica, use may be made of those which have been subjected to sufficient surface treatment, specifically, those preferably having a specific surface area of 150 $m^2/g$ or more and 250 $m^2/g$ or less, more preferably 170 $m^2/g$ or more and 230 $m^2/g$ or less.

Curing Inhibitor

Into an addition-curable silicone resin composition of the present invention may be mixed a curing inhibitor, for example, for the purpose of adjusting the rate of curing of the composition. Examples of a curing inhibitor include, for example, compounds selected from the group consisting of vinyl group-containing organopolysiloxanes such as tetramethyltetravinylcyclotetrasiloxane, hexavinyldisiloxane, and 1,3-divinyltetramethyldisiloxane; acetylenic alcohols such as ethynylcyclohexanol and 3-methyl-1-butyne-3-ol, and silane-modified products and siloxane-modified products thereof; hydroperoxide; tetramethylethylenediamine; benzotriazole; triallyl isocyanurate; alkyl maleate; and mixtures thereof. When a curing inhibitor is mixed, it may be added preferably in an amount of 0.001 to 1.0 part by weight, particularly preferably 0.005 to 0.5 parts by weight, based on 100 parts by weight of the entire silicone resin composition.

Heat Resistance Improver

Into an addition-curable silicone resin composition of the present invention may be mixed a heat resistance improver for the purpose of improving crack resistance under high temperature environments. The heat resistance improver has an effect against oxidative deterioration of silicone resins which occurs under high temperature environments, for example, at 180° C. or higher, e.g., an effect of preventing the increase in the hardness of the resin, for example, by cutting the length of the dimethylsiloxane chain. Examples of the heat resistance improver include, for example, cerium (III) tris(2-ethylhexanoate), trialkoxy cerium(III), and siloxane modified products of cerium(III).

The amount of a heat resistance improver to be mixed is preferably in the range of 0.1 to 100 ppm, more preferably in the range of 1 to 50 ppm, in terms of the weight of the metal element, based on 100 parts by weight of the entire silicone resin composition. When the amount of a heat resistance improver to be mixed is below the above range, there is a possibility that crack resistance under high temperature environments is reduced. On the other hand, when the amount of a heat resistance improver to be mixed exceeds the above range, there is a possibility that the decrease in the light transmittance of the cured silicone material due to its coloring is increased. In cases when the method of applying a die attach material is a stamping method, since the die attach material is put in a thin film state on the resin pan, it is suitable to use a heat resistance improver with low hydrolyzability.

An addition-curable silicone resin composition of the present invention may be applied onto a substrate, depending on applications, and then subjected to curing, preferably by heating at a temperature in the range of 60 to 200° C., more preferably 100 to 175° C. When the heating temperature is below the above range, there is a possibility that the strength of adhesion between the base material and the cured resin is reduced. Heating at temperatures exceeding the above range is not preferable because there is a possibility that bubbles are generated due to rapid volatilization of the solvent and deterioration of the resin takes place. The time for the heat curing may be 1 to 4 hours, and a method of stepwise curing may be adopted.

By using the above-described specific organohydrogenpolysiloxanes in a specified combination, an addition-curable silicone resin composition of the present invention has low levels of contamination to the gold pad portion on an LED chip during the curing of the composition and can result in good adhesiveness to the silver lead frame on a substrate formed of a reflector member, and therefore can be suitably used in applications for electrical and electronic parts, particularly as a die attach material for optical semiconductor devices.

EXAMPLES

Hereinafter, the present invention is described specifically with reference to Synthesis Examples, Working Examples, and Comparative Examples, but is not intended to be limited to the Examples which follow. Part(s) means "part(s) by weight", Me stands for "methyl group," Vi stands for "vinyl group," and Ep' stands for "γ-glycidoxypropyl group."

Synthesis Example 1

Organohydrogenpolysiloxane (b1-1)

Aqueous hydrochloric acid was added dropwise to a solution of 6 mol of an organodisiloxane represented by $(HMe_2Si)_2O$ and 3 mol of methyl polysilicate (manufactured by Tama Chemicals Co., Ltd.; product name: M Silicate 51, with a monomer content of 4.3 weight % or less) in isopropyl alcohol, and the mixture was stirred at room temperature (25° C.) for 5 hours. Toluene was added for dilution of the reaction mixture, from which the waste acid was separated, and the organic layer was washed with water until it became neutral. After dehydration of the organic layer, the solvent was distilled off by stripping under reduced pressure at 150° C. to obtain an organohydrogenpolysiloxane (b1-1) as a colorless transparent liquid substance having a viscosity at 25° C. of 1,200 Pa·s. For the obtained (b-1), the constituting siloxane units were represented by 50 mol % of $HMe_2SiO_{1/2}$ unit and 50 mol % of $SiO_4$ unit, the weight average molecular weight Mw by GPC measurement was 3,500, and the amount of SiH group was 0.72 mol/100 g. The content of SiH group-containing organosilicon compounds having 1 to 10 silicon atoms in (b1-1) was determined to be 0.34 weight %.

Synthesis Example 2

Organohydrogenpolysiloxane (b1-2)

Aqueous hydrochloric acid was added dropwise to a solution of 12 mol of an organodisiloxane represented by $(HMe_2Si)_2O$ and 3 mol of methyl polysilicate (manufactured by Tama Chemicals Co., Ltd.; product name: M Silicate 51, with a monomer content of 4.3 weight % or less) in isopropyl alcohol, and the mixture was stirred at room temperature (25° C.) for 5 hours. Toluene was added for dilution of the reaction mixture, from which the waste acid was separated, and the organic layer was washed with water until it became neutral. After dehydration of the organic layer, the solvent was distilled off by stripping under reduced pressure at 150° C. to obtain an organohydrogenpolysiloxane (b1-2) as a colorless transparent liquid substance having a viscosity at 25° C. of 2.6 Pa·s. For the obtained (b1-2), the constituting siloxane units were represented by 66 mol % of $HMe_2SiO_{1/2}$ unit and 34 mol % of $SiO_{4/2}$ unit, the weight average molecular weight Mw by GPC measurement was 1,300, and the amount of SiH group was 1.00 mol/100 g. The content of SiH group-containing organosilicon compounds having 1 to 10 silicon atoms in (b1-2) was determined to be 5.5 weight %.

Synthesis Example 3

Organohydrogenpolysiloxane (b1-3)

Aqueous hydrochloric acid was added dropwise to a solution of 6 mol of an organodisiloxane represented by $(HMe_2Si)_2O$ and 12 mol of a tetraalkoxysilane represented by $(MeO)_4Si$ in isopropyl alcohol, and the mixture was stirred at room temperature (25° C.) for 5 hours. Toluene was added for dilution of the reaction mixture, from which the waste acid was separated, and the organic layer was washed with water until it became neutral. After dehydration of the organic layer, the solvent was distilled off by stripping under reduced pressure at 150° C. to obtain an organohydrogenpolysiloxane (b1-3) as a colorless transparent liquid substance having a viscosity at 25° C. of 280 Pa·s. For the obtained (b1-3), the constituting siloxane units were represented by 52 mol % of $HMe_2S_{1/2}$ unit and 48 mol % of $SiO_{4/2}$ unit, the weight average molecular weight Mw by GPC measurement was 3,100, and the amount of SiH group was 0.74 mol/100 g. The content of the SiH group-containing organosilicon compound having 1 to 10 silicon atoms in (b1-3) was measured and found to be 28.4 weight %.

Component (A-1)

(a1-1): an organopolysiloxane represented by the formula:

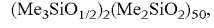

in which the amount of SiVi group was 0.045 mol/100 g and the viscosity at 25° C. was 55 mPa·s, and which was liquid at 25° C.

(a1-2): an organopolysiloxane represented by the formula:

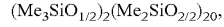

in which the amount of SiVi group was 0.146 mol/100 g and the viscosity at 25° C. was 14 mPa·s, and which was liquid at 25° C.

Component (A-2)

(a2-1): an organopolysiloxane in which the siloxane units were represented by 5.5 mol % of $Vi_3SiO_{1/2}$ unit, 46.5 mol % of $Me_3SiO_{1/2}$ unit, and 48.0 mol % of $SiO_{4/2}$ unit, the amount of SiVi group was 0.178 mol/100 g, and the weight average molecular weight Mw determined by GPC measurement was 3,800, and which was solid at 25° C.

(a2-2): an organopolysiloxane in which the siloxane units were represented by 6.7 mol % of $Vi_3SiO_{1/2}$ unit, 41.0 mol % of $Me_3SiO_{1/2}$ unit, and 52.3 mol % of $SiO_{4/2}$ unit, the amount of SiVi group amount was 0.228 mol/100 g, and the weight average molecular weight Mw determined by GPC measurement was 5,800, and which was solid at 25° C.

Component (B-2)
(b2-1): an organohydrogenpolysiloxane represented by the formula:

$(Me_3SiO_{1/2})_2(HMeSiO_{2/2})_{50}$, in which the amount of SiH group was 1.55 mol/100 g, and the content of SiH group-containing organosilicon compounds having 1 to 10 silicon atoms was 0.02 weight %, and which was liquid at 25° C.

(b2-2): an organohydrogenpolysiloxane represented by the formula:

$(Me_3SiO_{1/2})_2(HMeSiO_{2/2})_{18}$, in which the amount of SiH group was 1.56 mol/100 g, and the content of SiH group-containing organosilicon compounds having 1 to 10 silicon atoms was 37.03 weight %, and which was liquid at 25° C.

(b2-3): an organohydrogenpolysiloxane represented by the formula:

$(Me_3SiO_{1/2})_2(HMeSiO_{2/2})_{36}(Me_2SiO_{2/2})_{13}$, in which the amount of SiH group was 1.16 mol/100 g, and the content of SiH group-containing organosilicon compounds having 1 to 10 silicon atoms was 0.03 weight %, and which was liquid at 25° C.

Component (C)
(c-1): a solution of a tetramethyltetravinylcyclotetrasiloxane complex of platinum in tetramethyltetravinylcyclotetrasiloxane, in which the platinum content was 2 weight % and the amount of SiVi group was 1.15 mol/100 g.

Component (D)
(d-1): an organopolysiloxane in which the siloxane units were represented by 19 mol % of $MeSiO_{3/2}$ unit, 9 mol % of $Ep'MeSiO_{2/2}$ unit, 66 mol % of $Me_2SiO_{2/2}$ unit, 5 mol % of $ViMeSiO_{2/2}$ unit, and 1 mol % of $MeO_{1/2}$ unit, the weight average molecular weight Mw by GPC measurement was 1,900, the amount of SiVi group was 0.05 mol/100 g, and the epoxy equivalent was 860 g/mol, and which was liquid at 25° C.

(d-2): an organopolysiloxane in which the siloxane units were represented by 18 mol % of $MeSiO_{3/2}$ unit, 8 mol % of $Ep'SiO_{3/2}$ unit, 67 mol % of $Me_2SiO_{2/2}$ unit, 5 mol % of $ViMeSiO_{2/2}$ unit, and 2 mol % of $MeO_{1/2}$ unit, the weight average molecular weight Mw by GPC measurement was 2,200, the amount of SiVi group was 0.05 mol/100 g, and the epoxy equivalent was 865 g/mol, and which was liquid at 25° C.

Component (E)
(e-1): a hydrocarbon solvent "Hydroseal G3H", manufactured by TOTAL. [boiling point under atmospheric pressure (1013 hPa): 277 to 321° C.]

Inorganic Filler
(f-1): fumed silica "RX 300", manufactured by Nippon Aerosil Co., Ltd.

Examples 1 to 3 and Comparative Examples 1 to 6

Addition-curable silicone resin compositions of Examples 1 to 3 and Comparative Examples 1 to 6 were prepared according to the mixing ratios shown in Table 1 (in which the numerical values are expressed in parts by weight). Their hardness, non-contaminating property during curing, wire bonding property, and adhesiveness were evaluated by the test methods described below. The measurement results are shown in Table 1.

(a) Hardness
A cured silicone material was prepared by heating each of the addition-curable silicone resin compositions at 150° C. for 2 hours using a hot air circulation dryer. The cured silicone material was subjected to measurement using a type D durometer in accordance with JIS K 6253-3: 2012.

(b) Non-Contaminating Property During Curing
The non-contaminating property during the curing of the addition-curable silicone resin compositions was evaluated by the method described below in which a gold plated plate was used.

In a sealable container made of aluminum having a volume of 30 cm³, 1.0 g of the addition-curable silicone resin composition was placed together with a gold plated plate having an area of 2 cm² that had been gold plated by electrolytic plating, such that the silicone resin and the gold plated plate did not come into contact, and then the sealed container containing them was heated at 150° C. for 2 hours using a hot air circulation dryer. After heating, the container was cooled to 25° C. in a state where the container was kept closed. Then, the gold-plated plate was taken out from the container, and the state of adhesion of contaminants on the surface of the gold-plated plate was observed with the naked eye.

The non-contaminating property during curing was evaluated as "good (O)" when the proportion of contaminants adhering onto surface of the gold-plated plate was less than 5% of the total area of the surface, "acceptable (Δ)" when 5% or more and less than 25%, and "failure (X)" when 25% or more.

(c) Wire Bonding Property
The wire bonding property of the addition-curable silicone resin compositions was evaluated by the method described below.

A specified amount of the resin composition was applied to the center of each of the cavities of an SMD type 3030 package, in which the lead frame portion was a silver plating, the reflector member was an EMC, and they were cleaned by chemical etching after their formation, and LED chips (B 2424 (610 μm□), manufactured by GeneLite) was die-bonded. After that, the LED-bonded package was placed in an aluminum bag, which was the hermetically sealed, followed by heat curing at 150° C. for 2 hours using a hot air circulation dryer. Then, the bag was cooled to room temperature (25° C.) in a state where the bag was kept sealed, and then the lead frame was taken out from the bag. Thereafter, the electrodes on the LED chip and the surface of the lead frame were connected with a wire bonder (UTC-1000super, manufactured by Shinkawa Co., Ltd.) using a gold wire having a diameter of 30 μm. The ball shear strength of the 1 st ball portion on the electrode of the LEP chip (a total of 100 electrodes on the p and n sides) was measured with a bond tester (Dage 4000, manufactured by Nordson Advanced Technology) according to the method described in JESD 22-B116.

The wire bonding property was evaluated in terms of the number of electrodes which did not allow the formation and wire bonding of the 1st ball portion (number of wire bonding failures) and the average value of the ball shear strengths of all the 1 st ball portions which were allowed to be formed and on which the measurement of the ball shear strength was performed, in a total of 100 electrodes on which the wire bonding operation had been attempted. In this case, the ball shear strength was evaluated as follows: when the average value of the ball shear strengths in the case of using a thermosetting epoxy resin silver paste (product name: X-43-5603-7AQ, manufactured by Shin-Etsu Chemical Co., Ltd.) was set to be 100%, a calculation was performed to determine what percentage of it the average value of the ball shear strengths in the case of using the addition-curable silicone resin compositions shown in Examples 1 to 3 and Comparative Examples 1 to 6 corresponded to.

(d) Adhesiveness

A specified amount of the resin composition was applied to the center of each of the cavities of an SMD type 3030 package, in which the lead frame portion was a silver plating, the reflector member was an EMC, and they were cleaned by chemical etching after their formation, and LED chips (B2424 (610 μm☐), manufactured by GeneLite) was die-bonded, followed by heat curing at 150° C. for 2 hours using a hot-air circulation dryer. After heating, the package that had been removed was cooled to 25° C. The adhesion strength between the LED chip and the silver plating was measured in 50 tests for each of the resin compositions with a bond tester (Dage 4000, manufactured by Nordson Advanced Technology) to calculate the average adhesion strength. After the measurement, the surface of the silver plating was observed under a microscope, and the adhesiveness was evaluated as "remaining resin: good (O)" when the average of the resin remaining on the silver plating side was 70% or more in terms of the area ratio, "acceptable (Δ)" when 40% or more and less than 70%, and "failure (X)" when less than 40%.

understood that the invention may be practiced otherwise than as specifically described without departing from the scope of the appended claims.

The invention claimed is:

1. An addition-curable silicone resin composition comprising: as essential components,
   (A-1) a linear organopolysiloxane having, per molecule, two or more alkenyl groups having 2 to 8 carbon atoms;
   (A-2) a branched organopolysiloxane having, per molecule, two or more alkenyl groups having 2 to 8 carbon atoms, represented by the formula (1):

$$(R^1{}_3SiO_{1/2})_a(R^2{}_3SiO_{1/2})_b(SiO_{4/2})_c \qquad (1)$$

wherein $R^1$s are each an alkenyl group having 2 to 8 carbon atoms, $R^2$s are each an alkyl group having 1 to 12 carbon atoms, and $0<a<0.15$, $0.15 \le b<0.6$, and $0.25<c<0.7$, provided that $a+b+c=1$;
   (B-1) a liquid branched organohydrogenpolysiloxane having, per molecule, two or more hydrogen atoms directly bonded to a silicon atom, represented by the formula (2):

$$(HR^2{}_2SiO_{1/2})_d(R^2{}_3SiO_{1/2})_e(SiO_{4/2})_f \qquad (2)$$

wherein $R^2$s are each the same as defined above, and $0<d<0.6$, $0 \le e<0.4$, and $0<f<0.6$, provided that $d+e+f=1$,

TABLE 1

| | | Example | | | Comparative Example | | | | | |
|---|---|---|---|---|---|---|---|---|---|---|
| | | 1 | 2 | 3 | 1 | 2 | 3 | 4 | 5 | 6 |
| (A-1) | (a1-1) | 16.0 | | 16.0 | 16.0 | 15.0 | 17.0 | 17.1 | 17.0 | 16.0 |
| | (a1-2) | | 17.0 | | | | | | | |
| (A-2) | (a2-1) | 53.0 | | 53.0 | 53.0 | 60.0 | 54.5 | 52.0 | 52.0 | 51.0 |
| | (a2-2) | | 50.0 | | | | | | | |
| (B-1) | (b1-1) | 13.0 | 15.5 | 13.0 | 19.0 | | | | 13.0 | 16.0 |
| | (b1-2) | | | | | | 11.5 | | | |
| | (b1-3) | | | | | | | 12.9 | | |
| (B-2) | (b2-1) | 3.0 | 2.5 | 3.0 | | 10.0 | 2.0 | 3.0 | | |
| | (b2-2) | | | | | | | | 3.0 | |
| | (b2-3) | | | | | | | | | 2.0 |
| (C) | (c-1) | 0.025 | 0.025 | 0.025 | 0.025 | 0.025 | 0.025 | 0.025 | 0.025 | 0.025 |
| (D) | (d-1) | 5.0 | 5.0 | | 5.0 | 5.0 | 5.0 | 5.0 | 5.0 | 5.0 |
| | (d-2) | | | 5.0 | | | | | | |
| (E) | (e-1) | 3.0 | 3.0 | 3.0 | 3.0 | | 3.0 | 3.0 | 3.0 | 3.0 |
| Inorganic filler | (f-1) | 7.0 | 7.0 | 7.0 | 7.0 | 7.0 | 7.0 | 7.0 | 7.0 | 7.0 |
| SiH/SiVi | | 1.38 | 1.08 | 1.38 | 1.34 | 1.36 | 1.39 | 1.41 | 1.4 | 1.41 |
| Hardness (type D) | | 56 | 62 | 57 | 52 | 34 | 58 | 55 | 55 | 53 |
| Non-contaminating property during curing | | O | O | O | O | O | Δ | X | X | O |
| Number of wire bonding failures X: (per 100 sites) | | 0 | 0 | 0 | 0 | 8 | 11 | 23 | 74 | 0 |
| Ball shear strength (%) | | 99 | 98 | 98 | 97 | 75 | 73 | 62 | 33 | 98 |
| Adhesion strength (MPa) | | 17.7 | 19.2 | 15.4 | 11.5 | 7.5 | 16.3 | 16.5 | 15.3 | 14.7 |
| Fracture morphology | | O | O | Δ | X | O | O | O | O | Δ |

As a result of the above evaluation tests, the addition-curable silicone resin compositions of the present invention (Examples 1 to 3) were found to have low levels of contamination to the gold pad portion on the optical semiconductor chip during the curing of the composition, and to be excellent in the adhesiveness to the silver lead frame on a substrate formed of a reflector member. Accordingly, it was confirmed that the addition-curable silicone resin compositions of the present invention are extremely useful as a die attach material for optical semiconductor devices.

Japanese Patent Application No. 2017-027858 is incorporated herein by reference.

Although some preferred embodiments have been described, many modifications and variations may be made thereto in light of the above teachings. It is therefore to be wherein the weight average molecular weight of the polysiloxane is 1,500 to 6,000 and the content of SiH group-containing organosilicon compounds having 1 to 10 silicon atoms is 5 weight % or less;
(B-2) a linear organohydrogenpolysiloxane represented by the formula (3):

$$(R^2{}_3SiO_{1/2})_2(HR^2SiO_{2/2})_x(R^2{}_2SiO_{2/2})_y \qquad (3)$$

wherein $R^2$s are each the same as defined above, x and y are integers satisfying $0<x<100$ and $0 \le y<10$, provided that $20 \le x+y \le 100$, wherein the content of SiH group-containing organosilicon compounds having 1 to 10 silicon atoms is 5 weight % or less; and
(C) an addition reaction catalyst.

2. The addition-curable silicone resin composition according to claim 1,
wherein the linear organopolysiloxane serving as component (A-1) is an alkenyl group-containing linear organopolysiloxane represented by the formula (4):

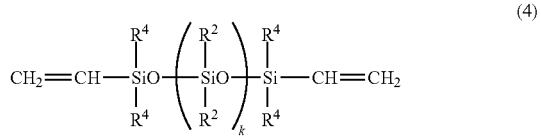

(4)

wherein $R^4$s are each independently an alkenyl group having 2 to 8 carbon atoms or an alkyl group having 1 to 12 carbon atoms, $R^2$ is an alkyl group having 1 to 12 carbon atoms, and k is an integer satisfying k>0 and allows the linear organopolysiloxane to have a viscosity at 25° C., measured by the method described in JIS Z 8803: 2011, of 10 to 1,000,000 mPa·s.

3. The addition-curable silicone resin composition according to claim 1,
wherein the component (B-1) has a viscosity at 25° C., measured by the method described in JIS Z 8803: 2011, of 10 Pas or higher.

4. The addition-curable silicone resin composition according to claim 1,
wherein the component (B-1) is an organohydrogenpolysiloxane prepared using a partial hydrolysate of a tetraalkoxysilane as a raw material.

5. The addition-curable silicone resin composition according to claim 4,
wherein in the $R^2$s of the components (A-1), (A-2), (B-1), and (B-2), 90 mol % or more of all the $R^2$s are a methyl group.

6. The addition-curable silicone resin composition according to claim 1, further comprising
(D) an adhesive aid component represented by the formula (5):

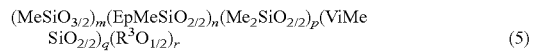

(5)

wherein Me is a methyl group, Ep is a monovalent organic group having an epoxy group, Vi is a vinyl group, $R^3$ is an alkyl group having 1 to 12 carbon atoms, and 0<m<0.3, 0<n<0.15, 0.4<p<0.8, 0<q<0.1, and 0≤r<0.05, provided that m+n+p+q+r=1.

7. The addition-curable silicone resin composition according to claim 1, further comprising, as (E) a diluent, a hydrocarbon compound that has a boiling point in the range of 200 to 350° C. under atmospheric pressure (1013 hPa) and is liquid at 25° C.

8. A die attach material for an optical semiconductor device, comprising the silicone resin composition according to claim 1.

* * * * *